(12) United States Patent
Jurasek et al.

(10) Patent No.: US 8,044,691 B2
(45) Date of Patent: Oct. 25, 2011

(54) METHOD FOR DETECTING MINIMUM OPERATIONAL FREQUENCY

(75) Inventors: Ryan Andrew Jurasek, S. Burlington, VT (US); Bret Roberts Dale, Jericho, VT (US); Darin James Daudelin, Williston, VT (US); Dave Eugene Chapmen, Shelburne, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/784,506

(22) Filed: May 21, 2010

(65) Prior Publication Data

US 2010/0231265 A1    Sep. 16, 2010

Related U.S. Application Data

(62) Division of application No. 12/105,280, filed on Apr. 18, 2008, now Pat. No. 7,750,684.

(51) Int. Cl.
    *H03L 7/00* (2006.01)
(52) U.S. Cl. .................. 327/142; 327/143; 327/333
(58) Field of Classification Search .............. 327/142, 327/143, 333
    See application file for complete search history.

(56) References Cited

U.S. PATENT DOCUMENTS

| | | | |
|---|---|---|---|
| 5,446,403 A * | 8/1995 | Witkowski | 327/143 |
| 5,933,036 A * | 8/1999 | Kim | 327/143 |
| 6,417,704 B1 * | 7/2002 | Nakajima et al. | 327/143 |
| 6,737,926 B2 | 5/2004 | Forbes | |
| 6,946,886 B2 * | 9/2005 | Isomura | 327/141 |
| 6,993,315 B1 * | 1/2006 | Frazier | 455/334 |
| 7,015,732 B1 * | 3/2006 | Holloway et al. | 327/143 |
| 7,057,427 B2 * | 6/2006 | Wadhwa et al. | 327/143 |
| 7,081,780 B2 * | 7/2006 | Briggs et al. | 327/143 |
| 7,184,798 B1 * | 2/2007 | Brown et al. | 455/574 |
| 7,196,561 B2 * | 3/2007 | Bhattacharya et al. | 327/143 |
| 7,518,419 B1 * | 4/2009 | Pasqualini | 327/143 |
| 2002/0052186 A1 * | 5/2002 | Deas et al. | 455/226.1 |
| 2005/0195022 A1 | 9/2005 | Lee | |
| 2007/0046369 A1 * | 3/2007 | Schober et al. | 330/7 |
| 2009/0156158 A1 * | 6/2009 | Kang et al. | 455/336 |
| 2009/0167093 A1 * | 7/2009 | Nguyen et al. | 307/80 |

FOREIGN PATENT DOCUMENTS

| | | |
|---|---|---|
| CN | 1246215 A | 3/2000 |
| TW | 200625814 | 7/2006 |
| TW | 1269953 | 1/2007 |

* cited by examiner

*Primary Examiner* — Lincoln Donovan
*Assistant Examiner* — Adam Houston
(74) *Attorney, Agent, or Firm* — Winston Hsu; Scott Margo

(57) ABSTRACT

A method of detecting a minimum operational frequency includes: generating a signal that becomes an oscillating signal at a first predetermined frequency; and generating a logic signal to provide a level transition when a frequency of the oscillating signal reaches a second predetermined frequency corresponding to the minimum operational frequency. The logic signal is generated by: providing a transistor that is activated at the second predetermined frequency; providing a capacitor; storing charges in the capacitor when the oscillating signal is below the second predetermined frequency; discharging the capacitor when the transistor is activated by the oscillating signal; and outputting the logic signal when the capacitor discharges.

6 Claims, 3 Drawing Sheets

METHOD FOR DETECTING MINIMUM OPERATIONAL FREQUENCY

CROSS REFERENCE TO RELATED APPLICATIONS

This divisional application claims the benefit of co-pending U.S. application Ser. No. 12/105,280, which was filed on Apr. 18, 2008, and is included herein by reference.

BACKGROUND OF THE INVENTION

1. Field of the Invention

The present invention relates to power-on detection circuits, and more particularly to power-on detection circuits for detecting a minimum operational frequency required to power-on a device.

2. Description of the Prior Art

Most circuits require certain minimum power levels for operation. It is therefore necessary to have some form of power detection circuit that can detect when this power level is reached, thereby determining that power-on is possible. If the power level detected is too low then the circuit will be unable to operate. If the power level detected is too high then some potential operational time, energy, and potential for lower voltage operation will have been wasted.

Please refer to FIG. 1. FIG. 1 is a diagram of a conventional power detection circuit 100. The circuit 100 comprises a first resistor R1 (12) coupled to a voltage supply, a second resistor R2 (14) coupled between R1 and ground, and a transistor 16 where the gate of the transistor 16 is coupled between R1 and R2. The source of the transistor 16 is coupled to a third resistor R3 (18) and an output device 20 and the drain of the transistor 16 is coupled to ground. The circuit 100 works by utilizing a ratio of the first resistance to the second resistance (R1/R2). When the ratio is above a certain voltage Vt it will power-on the transistor 16, causing the transistor 16 to pull down against the resistor R3, thereby generating a signal in the output device 20 that signifies that power is sufficient for power-on.

As the circuit 100 utilizes a ratio of two resistors, the level at which it is determined that power-on is possible is not as precise as desired. It is the aim of the present invention to provide a circuit and a method of power detection that can determine a minimum power required for power-on with a high level of accuracy.

SUMMARY OF THE INVENTION

With this in mind, it is an objective of the present invention to provide a method for detecting a minimum operational frequency to determine when power-on is possible.

A method of detecting a minimum operational frequency according to an exemplary embodiment of the present invention comprises: generating a signal that becomes an oscillating signal at a first predetermined frequency; and generating a logic signal to provide a level transition when a frequency of the oscillating signal reaches a second predetermined frequency corresponding to the minimum operational frequency. Frequency of the generated signal is increased to generate a first oscillating signal; and a second oscillating signal is generated by filtering the first oscillating signal to reduce noise. The second oscillating signal is generated at a third predetermined frequency and amplitude of the first oscillating signal, and the logic signal is generated after the second oscillating signal is generated.

In a first embodiment, the step of generating the logic signal after a frequency of the first oscillating signal reaches the second predetermined frequency comprises: providing a transistor that is activated when a frequency of the first oscillating signal reaches the second predetermined frequency; and generating the logic signal when the transistor is activated.

In a second embodiment, the step of generating the logic signal after a frequency of the first oscillating signal reaches the second predetermined frequency comprises: providing a capacitor; storing charges in the capacitor until a frequency of the first oscillating signal reaches the second predetermined frequency and discharging the capacitor when a frequency of the first oscillating signal reaches the second predetermined frequency; and outputting the logic signal when the capacitor discharges.

In a third embodiment, the step of generating the logic signal after a frequency of the first oscillating signal reaches the second predetermined frequency comprises: providing a transistor that is activated at the second predetermined frequency; providing a capacitor; storing charges in the capacitor when the first oscillating signal is below the second predetermined frequency; discharging the capacitor when the transistor is activated by the first oscillating signal; and outputting the logic signal when the capacitor discharges.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a circuit that utilizes a frequency as a means of detecting when power-on of a device is possible. The use of frequency enables a power-on threshold to be determined with higher accuracy than in related art methods.

Figure 1:
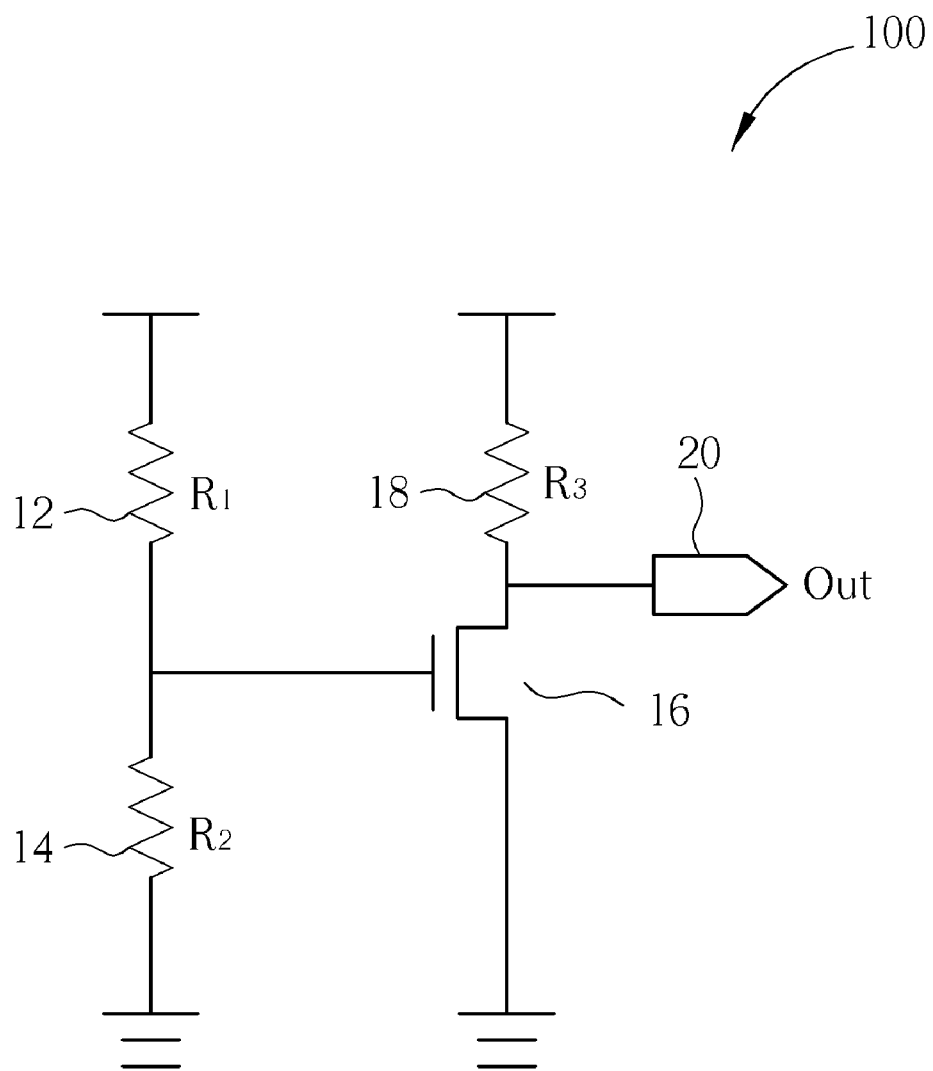
FIG. 1 is a diagram of a prior art power-on detection circuit.
Figure 2:
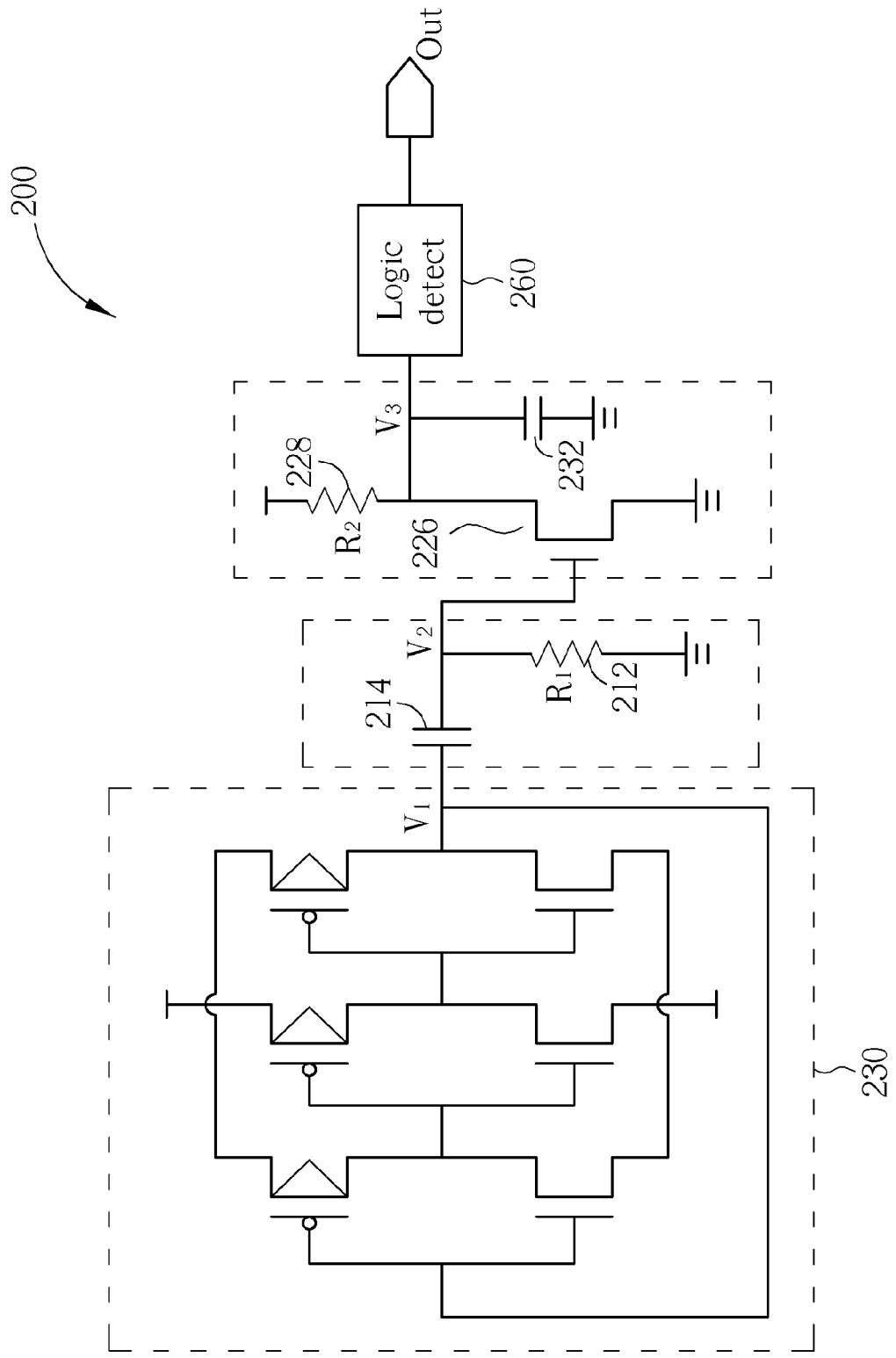
FIG. 2 is a diagram of a power-on detection circuit according to an exemplary embodiment of the present invention.

Please refer to FIG. 2. FIG. 2 is a diagram of a power-on detection circuit according to an exemplary embodiment of the present invention. The circuit 200 comprises three stages, as shown by the boxes in dashed lines, which are annotated as V1, V2 and V3. At each stage, a signal is generated, and the logic detect 260 outputs a logic signal when it is determined that power-on is possible according to the frequency of the signal.

The circuit 200 comprises a ring oscillator 230, coupled to a high pass RC filter consisting of capacitor 214 and resistor R1 (212). The high pass filter is coupled to a rectification device consisting of a transistor 226, a resistor R2 (228) and a capacitor 232 coupled between the drain of the transistor 226 and ground. The rectification device is coupled to the logic detect 260 for generating a logic signal when a frequency is sufficient to allow power-on.

Initially, the ring oscillator 230 generates an oscillating signal causing a first oscillating signal at V1 above a certain frequency. This first oscillating signal is then filtered by the high pass filter, causing a filtered oscillating signal (a second oscillating signal) to appear at V2. The second oscillating signal is fed into the rectification device. This signal initially has a frequency and amplitude too low to turn on the transistor 226, so it causes the capacitor 232 to store charges. A signal corresponding to the stored charge of the capacitor 232 is therefore present at V3. With an increase in frequency of the first oscillating signal generated by the ring oscillator 230 (and subsequently filtered by the high pass filter), the signal at V3 will increase, until a certain saturation point is reached. This saturation point corresponds to the second oscillating signal turning on the transistor 226. At this point, the transistor 226 will cause the capacitor 232 to discharge, and the signal at V3 will therefore be pulled down faster than the resistor R2 can pull it up. The logic detect circuit 260 detects this change and outputs a logic signal indicating that the minimum frequency for power-on has been reached.

Figure 3:
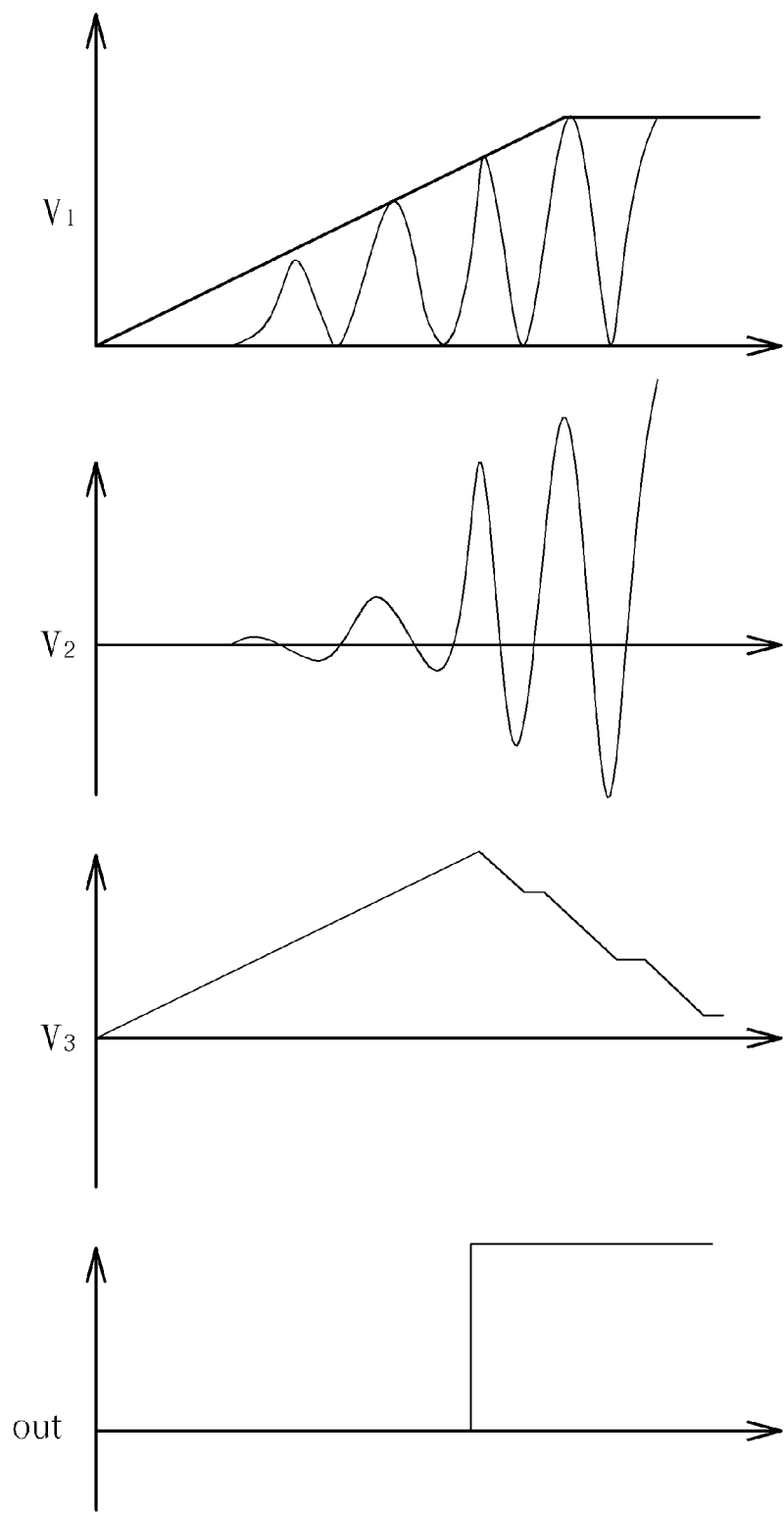
FIG. 3 is a diagram showing the operation of all stages in the power-on detection circuit shown in FIG. 2.

For a clearer illustration of the stages of the circuit 200, please refer to FIG. 3, which shows the output signals at stages V1, V2, V3 and the output of the logic detect 260. The ring oscillator starts to oscillate above a certain frequency, as shown in the graph of V1. The oscillations increase until the supply ramp is reached, at which point the oscillation frequency levels off.

At V2, because the signal is high pass filtered, the oscillating signal will only be passed at a certain frequency and amplitude. One advantage of the circuit 200 shown in FIG. 2 is that the high pass filter can be set precisely to only allow oscillating signals above a desired amplitude and frequency to be passed.

As can be seen in the V2 graph, the signal only goes high above a certain frequency and amplitude. Up to this point, the voltage at V3 has been steadily increasing. Once the signal at V2 starts to oscillate properly, however, the transistor 226 becomes operational, and the resistor R2 is unable to pull up the signal before the transistor 226 can pull it down. Therefore, there is a sudden drop in the voltage at V3.

The drop in the voltage at V3 is detected by the logic detect 260, which outputs a logic signal. This logic signal indicates that the power is sufficient for operations to commence.

Please note that the illustration of the rectification device in FIG. 2 is not a limitation of the present invention. Those skilled in the art will be able to see that the transistor 226 can be implemented by an NMOS or by a PMOS. The rectification device can also include a buffer (not shown).

The utilization of the ring oscillator ensures that the logic signal will be output at a certain frequency, as ring oscillators have a certain set frequency. The utilization of the high pass filter ensures a clear division between a point at which the transistor is not operational, and a point at which the transistor 226 is operational and can discharge the capacitor 232.

The power-on detection circuit therefore provides a system and method for precisely determining a power-on threshold.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of detecting a minimum operational frequency, comprising:
   generating a signal that becomes an oscillating signal at a first predetermined frequency, comprising:
   generating a first oscillating signal by increasing frequency of the generated signal; and
   generating a second oscillating signal by filtering the first oscillating signal to reduce noise; and
   generating a logic signal to provide a level transition when a frequency of the first oscillating signal reaches a second predetermined frequency corresponding to the minimum operational frequency;
   wherein the second oscillating signal is generated at a third predetermined frequency and a predetermined amplitude of the first oscillating signal, and the logic signal is generated after the second oscillating signal is generated.

2. A method of detecting a minimum operational frequency, comprising:
   generating a signal that becomes an oscillating signal at a first predetermined frequency, comprising:
   generating a first oscillating signal by increasing frequency of the generated signal; and
   generating a second oscillating signal by filtering the first oscillating signal to reduce noise; and
   generating a logic signal to provide a level transition when a frequency of the first oscillating signal reaches a second predetermined frequency corresponding to the minimum operational frequency, comprising:
   providing a transistor that is activated when the first oscillating signal reaches the second predetermined frequency; and
   generating the logic signal when the transistor is activated.

3. A method of detecting a minimum operational frequency, comprising:
   generating a signal that becomes an oscillating signal at a first predetermined frequency, comprising:
   generating a first oscillating signal by increasing frequency of the generated signal; and
   generating a second oscillating signal by filtering the first oscillating signal to reduce noise; and
   generating a logic signal to provide a level transition when a frequency of the first oscillating signal reaches a second predetermined frequency corresponding to the minimum operational frequency, comprising:
   providing a capacitor;
   storing charges in the capacitor until the first oscillating signal reaches the second predetermined frequency and discharging the capacitor when the first oscillating signal reaches the second predetermined frequency; and
   outputting the logic signal when the capacitor discharges.

4. A method of detecting a minimum operational frequency, comprising:
   generating a signal that becomes an oscillating signal at a first predetermined frequency; and
   generating a logic signal to provide a level transition when a frequency of the oscillating signal reaches a second predetermined frequency corresponding to the minimum operational frequency, comprising:
   providing a transistor that is activated at the second predetermined frequency;
   providing a capacitor;
   storing charges in the capacitor when the oscillating signal is below the second predetermined frequency;
   discharging the capacitor when the transistor is activated by the oscillating signal; and outputting the logic signal when the capacitor discharges.

5. The method of claim 4, wherein the step of generating the signal that becomes an oscillating signal at a first predetermined frequency comprises:
generating a first oscillating signal by increasing the frequency of the generated signal; and
generating a second oscillating signal by filtering the first oscillating signal to reduce noise.

6. The method of claim 5, wherein the second oscillating signal is generated at a third predetermined frequency and a predetermined amplitude of the first oscillating signal, and the logic signal is generated after the second oscillating signal is generated.

* * * * *